(12) United States Patent
Yanagida et al.

(10) Patent No.: US 11,705,399 B2
(45) Date of Patent: Jul. 18, 2023

(54) TERMINAL CONFIGURATION AND SEMICONDUCTOR DEVICE

(71) Applicant: ROHM CO., LTD., Kyoto (JP)

(72) Inventors: Hideaki Yanagida, Kyoto (JP);
Yoshihisa Takada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/851,313

(22) Filed: Jun. 28, 2022

(65) Prior Publication Data

US 2022/0328407 A1    Oct. 13, 2022

Related U.S. Application Data

(63) Continuation of application No. 17/003,124, filed on Aug. 26, 2020, now Pat. No. 11,404,375.

(30) Foreign Application Priority Data

Sep. 26, 2019  (JP) ................................. 2019-174862
Oct. 31, 2019  (JP) ................................. 2019-198563

(51) Int. Cl.
*H01L 23/528*   (2006.01)
*H01L 23/532*   (2006.01)
*H01L 23/00*    (2006.01)

(52) U.S. Cl.
CPC .... *H01L 23/5283* (2013.01); *H01L 23/53233* (2013.01); *H01L 23/53261* (2013.01); *H01L 24/20* (2013.01)

(58) Field of Classification Search
CPC .................................................... H01L 23/5283
USPC .......................................................... 257/758
See application file for complete search history.

(56) References Cited

U.S. PATENT DOCUMENTS

| 8,129,825 B2 | 3/2012 | Kudose et al. | |
| 2010/0123257 A1* | 5/2010 | Liu | H01L 25/0657 438/109 |
| 2015/0008566 A1* | 1/2015 | Gerber | H01L 24/19 257/668 |

FOREIGN PATENT DOCUMENTS

JP         2001257304 A      9/2001

* cited by examiner

*Primary Examiner* — Ajay Arora
(74) *Attorney, Agent, or Firm* — Hamre, Schumann, Mueller & Larson, P.C.

(57) ABSTRACT

There is provided a terminal that includes a first conductive layer; a wiring layer on the first conductive layer; a second conductive layer on the wiring layer; and a conductive bonding layer which is in contact with a bottom surface and a side surface of the first conductive layer, a side surface of the wiring layer, a portion of a side surface of the second conductive layer, and a portion of a bottom surface of the second conductive layer, wherein an end portion of the second conductive layer protrudes from an end portion of the first conductive layer and an end portion of the wiring layer, and wherein the conductive bonding layer is in contact with a bottom surface of the end portion of the second conductive layer.

18 Claims, 11 Drawing Sheets

TERMINAL CONFIGURATION AND SEMICONDUCTOR DEVICE

CROSS-REFERENCE TO RELATED APPLICATIONS

This application is a continuation application of U.S. application Ser. No. 17/003,124, filed Aug. 26, 2020, which was based upon and claims the benefit of priority from Japanese Patent Application Nos. 2019-174862 and 2019-198563, which were filed on Sep. 26, 2019, and Oct. 31, 2019, respectively. The entire contents of Japanese Patent Application Nos. 2019-174862 and 2019-198563 are incorporated herein by reference.

TECHNICAL FIELD

The present disclosure relates to a terminal and a semiconductor device.

BACKGROUND

In recent years, there exist leadless package-type semiconductor devices such as a small outline non-leaded package (SON package), a quad flat non-leaded package (QFN package), and the like. The leadless package-type semiconductor device is advantageous for miniaturizing and thinning of the semiconductor device because a terminal for external connection does not protrude from a sealing resin which seals a semiconductor element.

The leadless package-type semiconductor device includes, for example, a semiconductor element, a lead frame, and a sealing resin, wherein the lead frame has a die pad portion and a plurality of lead portions. The die pad portion supports the semiconductor element. The plurality of lead portions are terminals which are electrically connected to the semiconductor element via respective metal wirings and are used for external connection when the semiconductor device is mounted on a circuit board such as an electronic device or the like. The sealing resin covers the semiconductor element. For manufacturing such a semiconductor device, for example, a molded array packaging (MAP) method is used. In the MAP method, a plurality of semiconductor elements are collectively sealed with the sealing resin on the lead frame, and then cut into individual pieces by dicing.

If the lead frame, which is a terminal for external connection, is made of, for example, copper, the copper may be oxidized, resulting in adhesion failure with a conductive bonding material such as solder or the like. Further, in the case of an in-vehicle application, it is necessary to form copper to be thick, but if the copper is made too thick, a support member may be warped, which results in adhesion failure with the sealing resin. Such adhesion failure causes a reduction in yield of semiconductor devices and malfunctioning.

SUMMARY

Some embodiments of the present disclosure provide a terminal for external connection which suppresses adhesion failure and secures reliability. Further, another embodiment of the present disclosure provides a semiconductor device including the terminal. In addition, yet another embodiment of the present disclosure provides a method of manufacturing the terminal.

According to one embodiment of the present disclosure, a terminal includes: a first conductive layer; a wiring layer on the first conductive layer; a second conductive layer on the wiring layer; and a conductive bonding layer which is in contact with a bottom surface and a side surface of the first conductive layer, a side surface of the wiring layer, a portion of a side surface of the second conductive layer, and a portion of a bottom surface of the second conductive layer, wherein an end portion of the second conductive layer protrudes from an end portion of the first conductive layer and an end portion of the wiring layer, and wherein the conductive bonding layer is in contact with a bottom surface of the end portion of the second conductive layer.

According to another embodiment of the present disclosure, a semiconductor device includes: a terminal; a semiconductor element electrically connected to the terminal; and a resin covering the terminal and the semiconductor element, wherein the terminal includes: a first conductive layer; a second conductive layer; a wiring layer between the first conductive layer and the second conductive layer; and a conductive bonding layer which is in contact with the first conductive layer, the wiring layer, and the second conductive layer, wherein an end portion of the second conductive layer protrudes from an end portion of the first conductive layer and an end portion of the wiring layer, and wherein the conductive bonding layer is in contact with the end portion of the second conductive layer.

According to another embodiment of the present disclosure, a method of manufacturing a terminal includes: forming a first conductive layer; forming a first resin covering the first conductive layer; grinding the first resin to expose a top surface of the first conductive layer; forming a wiring layer which is in contact with the first conductive layer; forming a second conductive layer on the wiring layer; forming a second resin which covers the first resin, the wiring layer, and the second conductive layer; removing a portion of the first conductive layer, a portion of the wiring layer, a portion of the second conductive layer, and a portion of the second resin so that an end portion of the second conductive layer protrudes from an end portion of the first conductive layer and an end portion of the wiring layer; and forming a conductive bonding layer which is in contact with the first conductive layer, the wiring layer, and the second conductive layer.

According to another embodiment of the present disclosure, a method of manufacturing a semiconductor device includes the method of manufacturing the terminal and forming a semiconductor element electrically connected to the wiring layer after forming the wiring layer and before forming the second conductive layer.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A to 6C are schematic cross-sectional views illustrating a method of manufacturing a semiconductor device including a terminal according to an embodiment of the present disclosure, wherein FIG. 6A is a process of forming a conductive layer, FIG. 6B is a process of forming a resin, and FIG. 6C is a process of grinding the resin.

FIGS. 7A to 7C are schematic cross-sectional views illustrating a method of manufacturing a semiconductor device including a terminal according to an embodiment of the present disclosure, wherein FIG. 7A is a process of forming a wiring layer, FIG. 7B is a process of forming a semiconductor element, and FIG. 7C is a process of forming a conductive layer.

FIGS. 8A and 8B are schematic cross-sectional views illustrating a method of manufacturing a semiconductor device including a terminal according to an embodiment of the present disclosure, wherein FIG. 8A is a process of forming a resin and FIG. 8B is a process of cutting a support base material.

FIGS. 9A and 9B are schematic cross-sectional views illustrating a method of manufacturing a semiconductor device including a terminal according to an embodiment of the present disclosure, wherein FIG. 9A is a process of grinding a support base material and FIG. 9B is a process of forming a conductive bonding layer.

FIGS. 14A and 14B are schematic cross-sectional views illustrating a method of manufacturing a semiconductor device including a terminal according to another embodiment of the present disclosure, wherein FIG. 14A is a process of removing a portion of a conductive layer 12, a portion of wiring layer 14, a portion of conductive layer 16, and a portion of resin, and FIG. 14B is a process of forming a conductive bonding layer.

DETAILED DESCRIPTION

Figure 1:
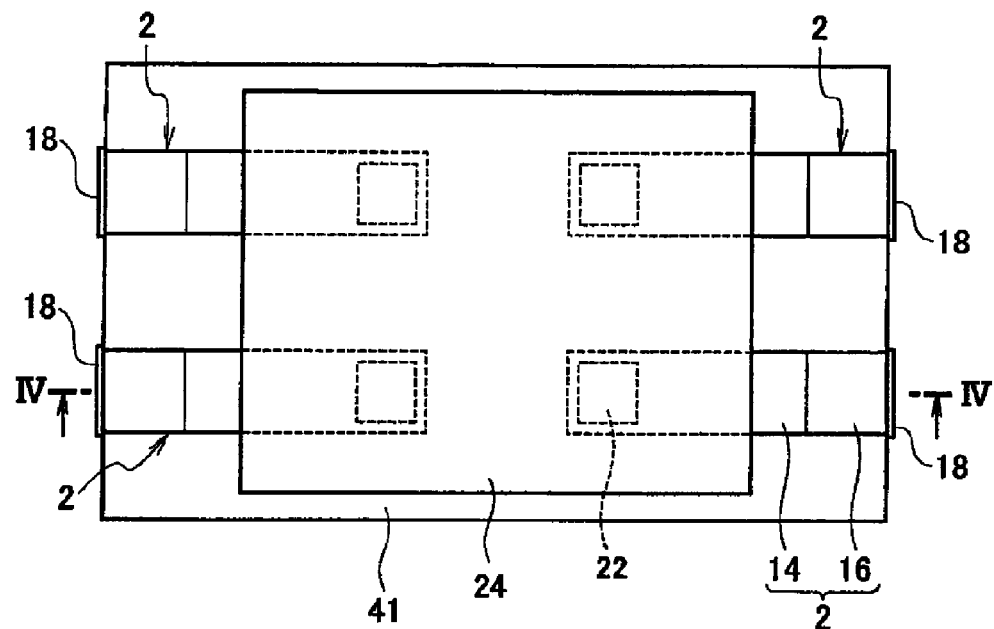
FIG. 1 is a schematic plan view of a semiconductor device including a terminal according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will now be described with reference to the drawings. In the following description of the drawings, like or similar parts are denoted by like or similar reference numerals. However, it should be noted that the drawings are schematic and that the relationships between thicknesses and planar dimensions, and the like of respective components are different from those of reality. Therefore, specific thicknesses or dimensions should be determined in consideration of the following description. Also, it is understood that parts having different dimensional relationships or ratios are included among the drawings.

Further, the embodiments described below are presented to illustrate apparatuses or methods for embodying the technical concept of the present disclosure and are not intended to specify the materials, features, structures, arrangements, and the like of the components. The embodiments may be variously modified without departing from the scope of the accompanying claims.

One aspect of the present disclosure is as follows.

[1] A terminal includes: a first conductive layer; a wiring layer on the first conductive layer; a second conductive layer on the wiring layer; and a conductive bonding layer which is in contact with a bottom surface and a side surface of the first conductive layer, a side surface of the wiring layer, a portion of a side surface of the second conductive layer, and a portion of a bottom surface of the second conductive layer, wherein an end portion of the second conductive layer protrudes from an end portion of the first conductive layer and an end portion of the wiring layer, and wherein the conductive bonding layer is in contact with a bottom surface of the end portion of the second conductive layer.

[2] In the terminal of [1], the second conductive layer is thicker than the first conductive layer, and the wiring layer is thinner than the first conductive layer.

[3] In the terminal of [1] or [2], a distance between the bottom surface of the first conductive layer and the bottom surface of the end portion of the second conductive layer is 100 μm or more.

[4] In the terminal of any one of [1] to [3], the end portion of the second conductive layer protrudes 10 to 20 μm.

[5] In the terminal of any one of [1] to [4], the conductive bonding layer includes: a Ni layer which is in contact with the bottom surface of the first conductive layer, the side surface of the wiring layer, a portion of the side surface of the second conductive layer, and a portion of the bottom surface of the second conductive layer; and an Au layer overlapping with the Ni layer.

[6] In the terminal of any one of [1] to [5], an average surface roughness of a top surface of the second conductive layer is 2 to 5 μm.

[7] In the terminal of any one of [1] to [6], a material of the first conductive layer is identical to a material of the second conductive layer.

[8] In the terminal of any one of [1] to [7], the first conductive layer contains copper, the wiring layer contains titanium or tantalum nitride, and the second conductive layer contains copper.

[9] In the terminal of any one of [1] to [8], the end portion of the wiring layer is covered with a material of the first conductive layer and a material of the second conductive layer.

[10] A semiconductor device includes: a terminal; a semiconductor element electrically connected to the terminal; and a resin covering the terminal and the semiconductor element, wherein the terminal includes: a first conductive layer; a second conductive layer; a wiring layer between the first conductive layer and the second conductive layer; and a conductive bonding layer which is in contact with the first conductive layer, the wiring layer, and the second conductive layer, wherein an end portion of the second conductive layer protrudes from an end portion of the first conductive layer and an end portion of the wiring layer, and wherein the conductive bonding layer is in contact with the end portion of the second conductive layer.

[11] In the semiconductor device of [10], the second conductive layer is thicker than the first conductive layer, and the wiring layer is thinner than the first conductive layer.

[12] In the semiconductor device of [10] or [11], a distance between a bottom surface of the first conductive layer and a bottom surface of the end portion of the second conductive layer is 100 μm or more.

[13] In the semiconductor device of any one of [10] to [12], the end portion of the second conductive layer protrudes 10 to 20 μm.

[14] In the semiconductor device of any one of [10] to [13], the conductive bonding layer includes a Ni layer which is in contact with the first conductive layer, the wiring layer, and the second conductive layer; and an Au layer overlapping with the Ni layer.

[15] In the semiconductor device of any one of [10] to [14], an average surface roughness of a top surface of the second conductive layer is 2 to 5 μm.

[16] In the semiconductor device of any one of [10] to [15], a material of the first conductive layer is identical to a material of the second conductive layer.

[17] In the semiconductor device of any one of [10] to [16], the first conductive layer contains copper, the wiring layer contains titanium or tantalum nitride, and the second conductive layer contains copper.

[18] In the semiconductor device of any one of [10] to [17], the end portion of the wiring layer is covered with a material of the first conductive layer and a material of the second conductive layer.

[19] In the semiconductor device of any one of [10] to [18], an outer side surface of the second conductive layer is exposed.

[20] A method of manufacturing a terminal includes: forming a first conductive layer; forming a first resin covering the first conductive layer; grinding the first resin to expose a top surface of the first conductive layer; forming a wiring layer which is in contact with the first conductive layer; forming a second conductive layer on the wiring layer; forming a second resin which covers the first resin, the wiring layer, and the second conductive layer; removing a portion of the first conductive layer, a portion of the wiring layer, a portion of the second conductive layer, and a portion of the second resin, so that an end portion of the second conductive layer protrudes from an end portion of the first conductive layer and an end portion of the wiring layer; and forming a conductive bonding layer which is in contact with the first conductive layer, the wiring layer, and the second conductive layer.

[21] In the method of manufacturing the terminal of [20], the second conductive layer is thicker than the first conductive layer, and the wiring layer is thinner than the first conductive layer.

[22] In the method of manufacturing the terminal of [20] or [21], a distance between a bottom surface of the first conductive layer and a bottom surface of the end portion of the second conductive layer is 100 μm or more.

[23] In the method of manufacturing the terminal of any one of [20] to [22], an outer side surface of the second conductive layer is exposed.

[24] A method of manufacturing a semiconductor device includes the method of manufacturing the terminal of any one of [20] or [23]; and forming a semiconductor element electrically connected to the wiring layer after forming the wiring layer and before forming the second conductive layer.

First Embodiment

A terminal and a method of manufacturing the same according to an embodiment of the present disclosure will be described with reference to the drawings.

FIGS. 1 to 5 illustrate a semiconductor device including a terminal according to an embodiment of the present disclosure. The semiconductor device including a terminal according to an embodiment of the present disclosure includes an internal electrode 2, an external electrode 18, a resin 20, a conductive bonding layer 22, a semiconductor element 24, and an insulating layer 41.

Figure 2:
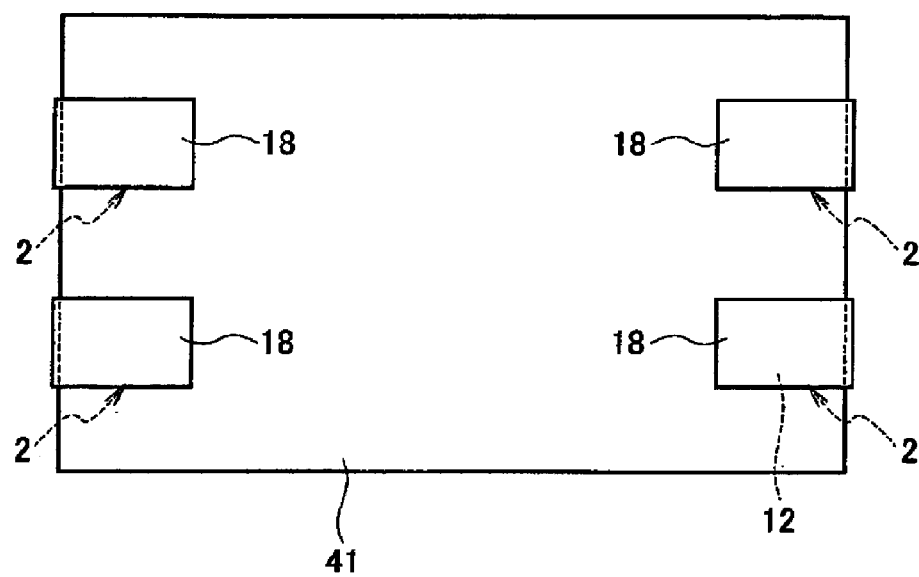
FIG. 2 is a schematic bottom view of the semiconductor device including a terminal according to an embodiment of the present disclosure.
Figure 3:
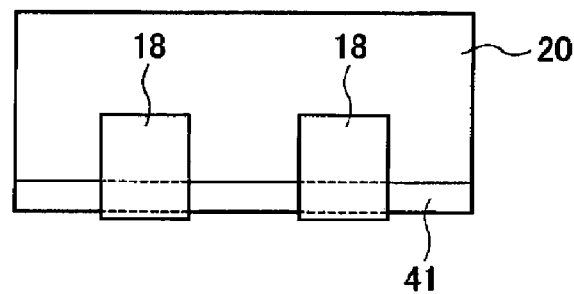
FIG. 3 is a schematic side view of the semiconductor device including a terminal according to an embodiment of the present disclosure.
Figure 4:
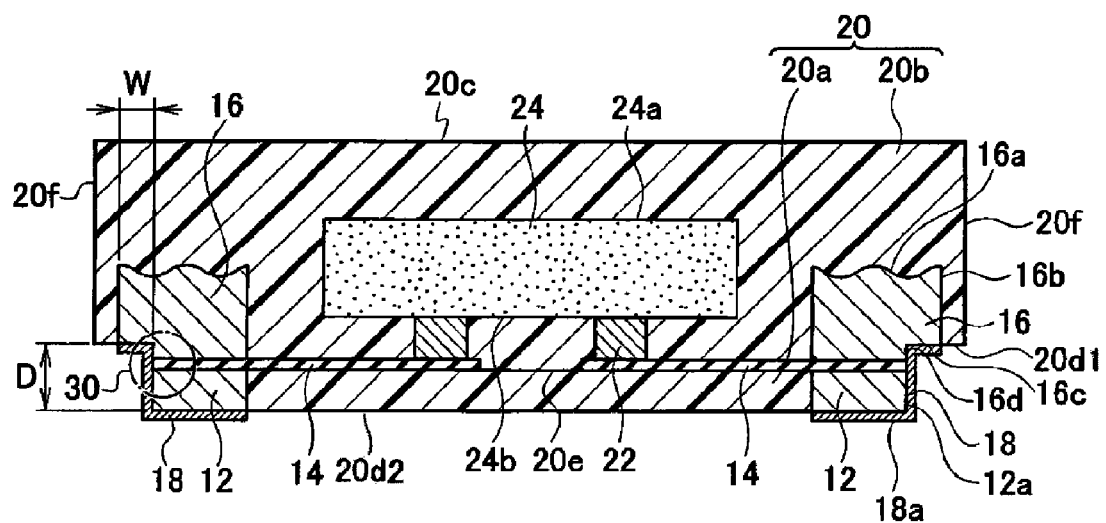
FIG. 4 is a schematic cross-sectional view taken along line IV-IV in FIG. 1.
Figure 5:
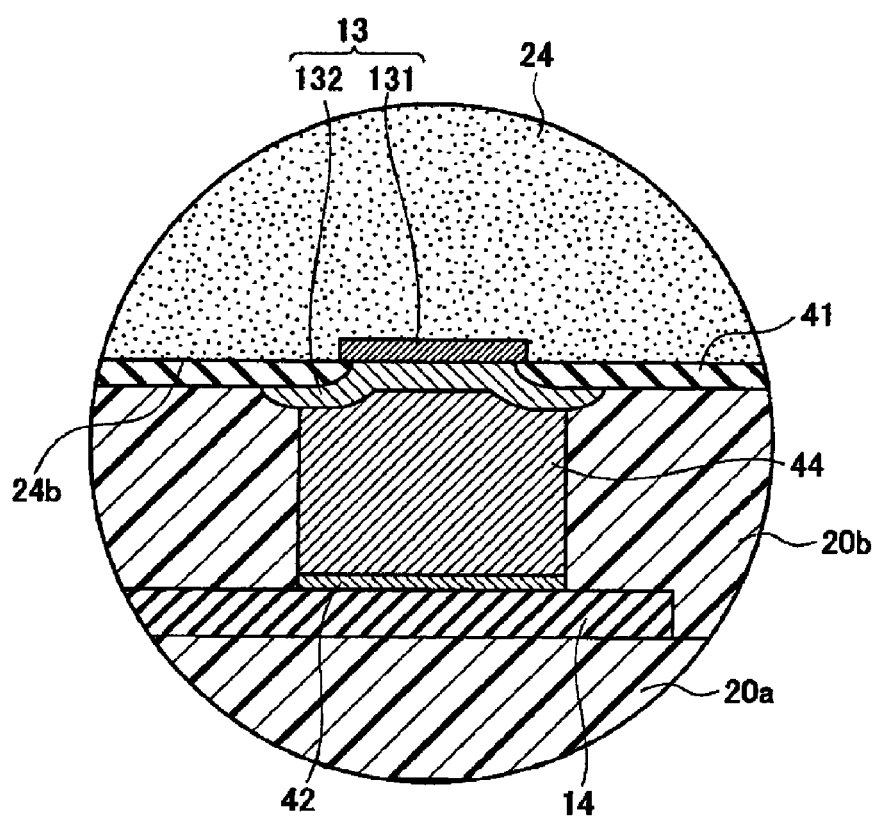
FIG. 5 is an enlarged schematic cross-sectional view of a portion of the schematic cross-sectional view illustrated in FIG. 4.

FIG. 1 is a schematic plane view of a semiconductor device including a terminal according to an embodiment of the present disclosure, FIG. 2 is a schematic bottom view of the semiconductor device including the terminal according to an embodiment of the present disclosure, FIG. 3 is a schematic side view of the semiconductor device including the terminal according to an embodiment of the present disclosure, FIG. 4 is a schematic cross-sectional view taken along line IV-IV in FIG. 1, and FIG. 5 is an enlarged schematic cross-sectional view of a portion of the schematic cross-sectional view illustrated in FIG. 4.

First, the semiconductor device including the terminal according to the present embodiment will be described with reference to FIGS. 1 to 5.

The semiconductor device including the terminal according to the present embodiment includes a terminal, a semiconductor element 24 electrically connected to the terminal via a conductive bonding layer 22, and a resin 20 covering the terminal and the semiconductor element 24, wherein the terminal includes a conductive layer 12, a wiring layer 14 on the conductive layer 12, a conductive layer 16 on the wiring layer 14, and an external electrode 18 which is in contact with a bottom surface and a side surface of the conductive layer 12, a side surface of the wiring layer 14, a portion (side surface 16d) of the side surface of the conductive layer 16, and a portion (bottom surface 16c) of the bottom surface of the conductive layer 16. Further, the conductive bonding layer 22 is installed on the wiring layer 14 to be in contact therewith. In addition, the conductive layer 12, the wiring layer 14, and the conductive layer 16 will be generally referred to as the internal electrode 2.

In the present disclosure, the external electrode is described as a portion of the terminal, but the present disclosure may not be limited thereto and the external electrode may be interpreted not to be included as a portion of the terminal.

The semiconductor device is a package mounted on a circuit board of various electronic devices or the like. The semiconductor device has a rectangular shape, as illustrated in FIGS. 1 and 2. The semiconductor device including the terminal according to the present embodiment is a so-called SON package type.

The semiconductor element 24 is an element that serves as a functional center of the semiconductor device. The semiconductor element 24 is, for example, an integrated circuit (IC) such as large scale integration (LSI) or the like. Further, the semiconductor element 24 may be a voltage control element such as low drop out (LDO), an amplification element such as an operational amplifier, and a discrete semiconductor element such as a capacitor, a transistor or a diode. The semiconductor element 24 has a rectangular shape. The semiconductor element 24 is mounted on the internal electrode 2. The semiconductor element 24 overlaps with the insulating layer 41. The semiconductor element 24 is mounted by flip chip bonding (FCB).

The semiconductor element 24 has an element front surface 24*a* and an element rear surface 24*b*. Both the element front surface 24*a* and the element rear surface 24*b* are flat. As illustrated in FIG. 5, a plurality of electrode pads 13 and an insulating layer 41 are formed on the element rear surface 24*b*. Each of the plurality of electrode pads 13 has a rectangular shape. As illustrated in FIG. 5, each electrode pad 13 is configured by a conductive bonding material 44, which is a part of the conductive bonding layer 22, and a seed layer 42, and is bonded to the conductive bonding material 44. Each electrode pad 13 includes a first conductive portion 131 and a second conductive portion 132.

The first conductive portion 131 is made of, for example, aluminum. The second conductive portion 132 is configured by a titanium (Ti) layer and a copper (Cu) layer which are stacked on each other. In the second conductive portion 132, the Cu layer is in contact with the first conductive portion 131. By installing the second conductive portion 132 in the electrode pad 13, it is possible to prevent the first conductive portion 131 made of aluminum from penetrating into the conductive bonding material 44.

The insulating layer 41 is a protective film of the semiconductor element 24 formed to cover the element rear surface 24*b*. The insulating layer 41 is, for example, a layer in which a silicon nitride layer formed by a chemical vapor deposition (CVD) method and a polyimide resin layer or a polybenzoxazole (PBO) resin layer formed by coating are stacked on each other. The insulating layer 41 is opened in multiple portions, and the electrode pads 13 are respectively exposed from the opened portions. Furthermore, the positions of the electrode pads 13 may not be limited to those described above, and for example, the electrode pads 13 may be buried in the insulating layer 41 to be in contact with the element rear surface 24*b*.

As the seed layer 42, for example, a layer having titanium or tantalum nitride as a main component and a thickness of 100 to 800 nm may be used. The conductive bonding material 44 is a conductive member interposed between the seed layer 42 and the semiconductor element 24. In the present embodiment, the conductive bonding material 44 is configured so that a Ni layer, a solder layer, a Ni layer, and a Cu layer are installed sequentially from a side that is in contact with the seed layer 42. The solder layer is made of an alloy containing Sn (tin). This alloy may include, for example, a lead-free solder such as a Sn—Sb based alloy, a Sn—Ag based alloy or the like, and a lead-containing solder.

As the conductive layer 12, for example, a layer having copper as a main component and a thickness of 20 to 50 μm may be used. The conductive layer 12 may be formed by a physical vapor deposition (PVD) method or the like such as a sputtering method. A side surface 12*a* of the conductive layer 12 is in contact with the external electrode 18. Alternatively, the conductive layer 12 may be formed on the seed layer. As the seed layer, for example, a layer having titanium or tantalum nitride as a main component and a thickness of 100 to 800 nm may be used. The materials, thicknesses, and forming methods of the conductive layer 12 and the seed layer may not be limited to those described above.

The wiring layer 14 functions as a seed layer of the conductive layer 16. The wiring layer 14 may be formed by a PVD method or the like. As the wiring layer 14, for example, a layer having titanium or tantalum nitride as a main component and a thickness of 100 to 800 nm, or a layer obtained by further stacking a Cu layer on the layer may be used. The material, thickness, and forming method of the wiring layer 14 may not be limited to those described above.

As the conductive layer 16, for example, a layer having copper as a main component and a thickness of 40 to 100 μm, which is thicker than that of the conductive layer 12, may be used. The conductive layer 16 may be formed by a plating method or the like. The material of the conductive layer 16 may be identical to the material of the conductive layer 12.

Further, one end portion of the conductive layer 16 protrudes from the end portion of the conductive layer 12 and the end portion of the wiring layer 14. That is, the terminal according to the present embodiment is configured to be uneven. In such a configuration, even if the side surface 12*a* of the conductive layer 12 on the end portion side where a portion of the conductive layer 16 protrudes, a side surface of the wiring layer 14, and a side surface 16*d* of the conductive layer 16 in a region that does not protrude (hereinafter, referred to as an end surface) become uneven due to oxidation or the like, since the external electrode 18 is formed to be in contact with the end surfaces and a bottom surface 16*c* of the end portion of the conductive layer 16, it may be configured such that the end surface is not visible from an outside of the terminal or the semiconductor device including the terminal while suppressing adhesion failure with the conductive bonding material such as solder or the like and securing reliability.

Furthermore, a top surface 16*a* of the conductive layer 16 is rougher than an outer side surface 16*b*. The top surface 16*a* of the conductive layer 16 does not need to be flat because it is covered with the resin 20, and for example, an average surface roughness of the top surface 16*a* of the conductive layer 16 is desirably 2 to 5 μm. When the top surface 16*a* of the conductive layer 16 is rough, the resin 20 enters into fine irregularities on the top surface of the conductive layer 16 and then is cured, thereby improving the adhesion. In addition, the average surface roughness may be obtained according to, for example, JIS B 0601:2013 or ISO 25178.

In addition, in the terminal according to the present embodiment, a distance D between the bottom surface of the conductive layer 12 and the bottom surface of the end portion of the conductive layer 16 is 100 μm or more, and the distance D may be 100 to 150 μm. Further, in the terminal according to the present embodiment, a width W of the protruding end portion of the conductive layer 16 is 10 μm or more, and may be 10 to 20 μm from the viewpoint of cost.

The external electrode 18 is electrically connected to be in contact with the conductive layer 12, the wiring layer 14, and the conductive layer 16, and a connection surface 18*a* is exposed to an outside. The external electrode 18 functions as a terminal used when the semiconductor device is mounted on the circuit board. The external electrode 18 may be formed by a plating method or the like. In the terminal according to the present embodiment, the external electrode 18 is configured by a Ni layer, a Pd layer, and an Au layer. The Ni layer is in contact with the end surface, and has a thickness of 3 μm. In the case where the main components of the conductive layer 12 and the conductive layer 16 are copper, when the solder used for electrical connection to an external device is directly bonded, the copper and the solder may form an alloy to generate a void. In order to suppress the generation of the alloy of copper and solder, the Ni layer functioning as a barrier layer may be installed. The Au layer is exposed to an outside as the connection surface 18a, and has a thickness of 0.01 to 0.02 μm. The Au layer is desirable because it has excellent adhesion to solder. Further, the Pd layer is located between the Ni layer and the Au layer, and has a thickness of 0.01 to 0.02 μm. The Pd layer also functions as a barrier layer for suppressing the generation of the alloy of copper and solder, but when the generation of the alloy of copper and solder can be sufficiently suppressed by only the Ni layer, the Pd layer may not be installed. The material, thickness, and forming method of the external electrode 18 may not be limited to those described above.

As the resin 20, for example, a synthetic resin containing an epoxy resin as a main component, a polyimide resin, or the like may be used. As illustrated in FIG. 4, the resin 20 covers the conductive layer 12, the wiring layer 14, and the conductive layer 16 which are the components of the terminal according to the present embodiment.

The resin 20 has a resin front surface 20c, a resin rear surface 20d1, a resin rear surface 20d2, a resin interface 20e, and a resin side surface 20f. The resin front surface 20c, the resin rear surface 20d1, the resin rear surface 20d2, and the resin interface 20e are all flat. The resin interface 20e is an interface made of a resin 20a and a resin 20b.

A method of manufacturing the terminal and a method of manufacturing a semiconductor element including the terminal according to the present embodiment will now be described with reference to FIGS. 6A to 9B.

Figure 6A:
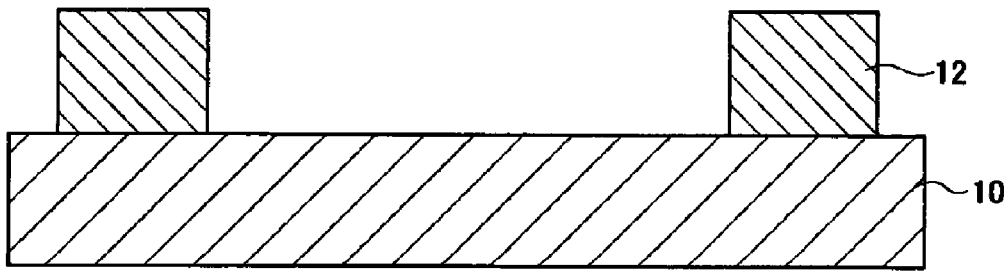

First, as illustrated in FIG. 6A, a support base material 10 is prepared, and a conductive layer 12 is formed on the support base material 10. As the support base material 10, for example, a glass substrate, a silicon substrate, or the like may be used. In the present embodiment, the silicon substrate is used as the support base material 10. The conductive layer 12 contains copper as a main component, and is formed by a sputtering method. In a process of forming the conductive layer 12, first, a resist is patterned on a conductive film to be the conductive layer 12 by photolithography. A portion of the conductive film to be the conductive layer 12 is removed using the patterned resist to form the conductive layer 12. Then, the conductive layer 12 illustrated in FIG. 6A is formed by removing the resist.

Figure 6B:
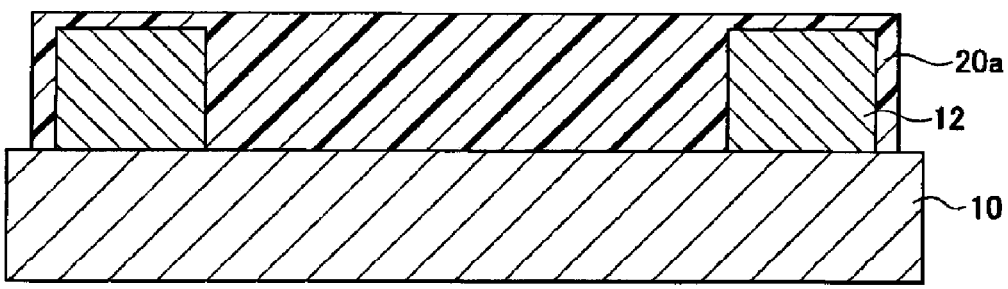

Next, as illustrated in FIG. 6B, a resin 20a covering the support base material 10 and the conductive layer 12 is formed. The resin 20a corresponds to a portion of the resin 20 described above. As the resin 20a in the present embodiment, a resin having electrical insulation, for example, a synthetic resin containing an epoxy resin as a main component, a polyimide resin, or the like, may be used.

Figure 6C:
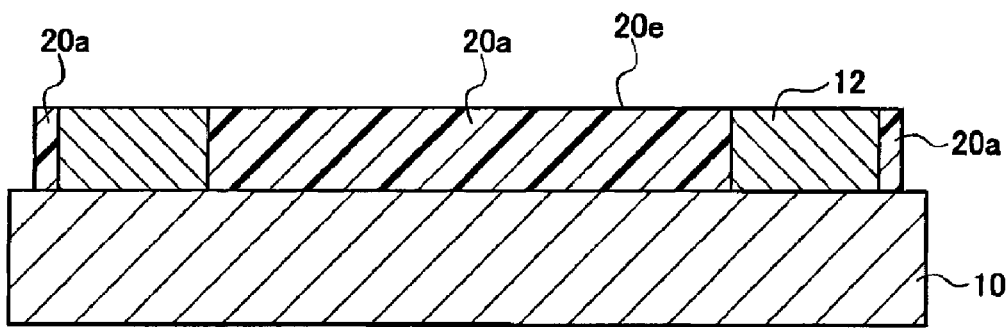

Next, as illustrated in FIG. 6C, the resin 20a is ground using a grindstone or the like to expose a top surface of the conductive layer 12. A top surface of the ground resin 20a becomes a resin interface 20e with a resin 20b to be formed later.

Figure 7A:
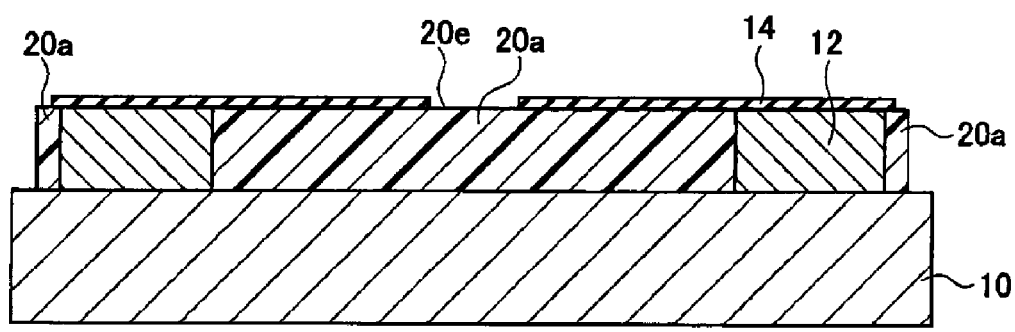

Next, as illustrated in FIG. 7A, a wiring layer 14 is formed to be in contact with the entire top surface of the conductive layer 12 and a portion of the top surface (resin interface 20e) of the ground resin 20a. In the present embodiment, the wiring layer 14 contains titanium as a main component, and is formed by a sputtering method. In a process of forming the wiring layer 14, first, a resist is patterned on a conductive film to be the wiring layer 14 by photolithography. A portion of the conductive film to be the wiring layer 14 is removed by using the patterned resist to form the wiring layer 14. Then, the wiring layer 14 illustrated in FIG. 7A is formed by removing the resist.

Figure 7B:
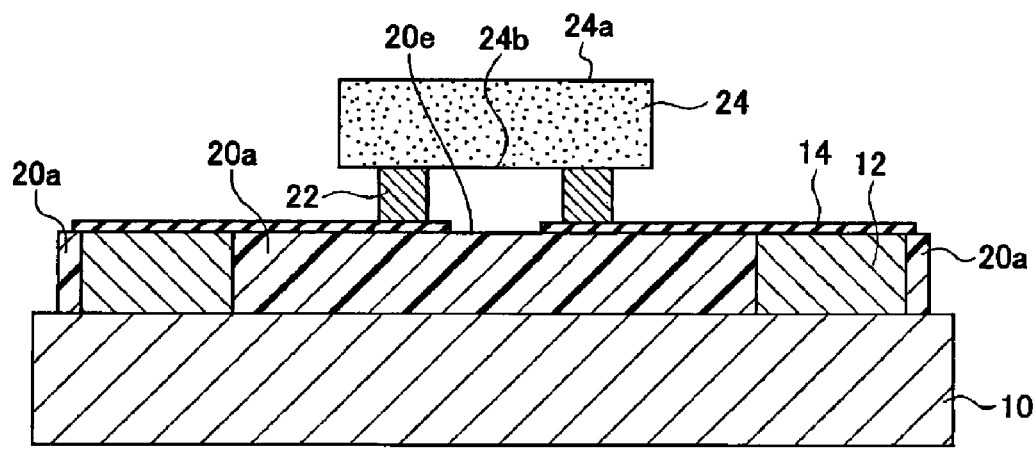

Next, as illustrated in FIG. 7B, a conductive bonding layer 22 is formed on the wiring layer 14. In the present embodiment, the conductive bonding layer 22 is formed of a seed layer and a conductive bonding material, as described above. As the seed layer in the conductive bonding layer 22, for example, a layer having titanium or tantalum nitride as a main component and a thickness of 100 to 800 nm may be used. The conductive bonding material in the conductive bonding layer 22 is formed of a Ni layer and a lead-free solder layer such as a Sn—Sb based alloy, a Sn—Ag based alloy or the like which is in contact with the Ni layer, and is formed by a plating method. In a process of forming the conductive bonding layer 22, first, a resist is patterned on a conductive film to be the conductive bonding layer 22 by photolithography. A portion of the conductive film to be the conductive bonding layer 22 is removed by using the patterned resist to form the conductive bonding layer 22. Thereafter, the conductive bonding layer 22 illustrated in FIG. 7B is formed by removing the resist.

Next, a semiconductor element 24 which is in contact with the conductive bonding layer 22 is mounted. An element rear surface 24b of the semiconductor element 24 is in contact with the conductive bonding layer 22. In the present embodiment, a process of mounting the semiconductor element 24 is performed by FCB. A flux is applied to the electrode pads 13 of the semiconductor element 24, and then the semiconductor element 24 is temporarily adhered to the conductive bonding layer 22 while facing the wiring layer 14 by using a flip chip bonder. At this time, the conductive bonding layer 22 is sandwiched between the wiring layer 14 and the semiconductor element 24. Next, the conductive bonding layer 22 is melted by reflow, and then the conductive bonding layer 22 is solidified by cooling, whereby the mounting of the semiconductor element 24 is completed.

Figure 7C:
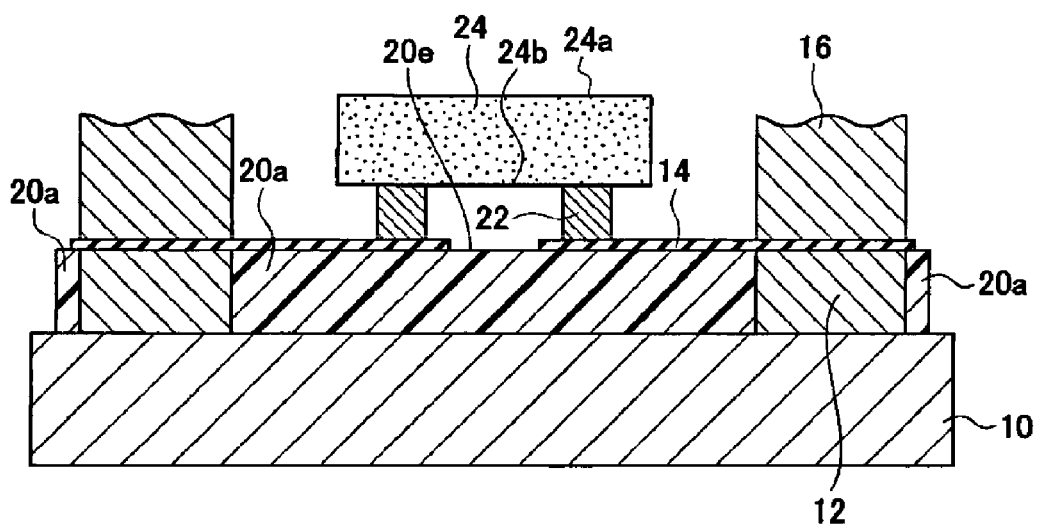

Next, as illustrated in FIG. 7C, a conductive layer 16 is formed on the wiring layer 14. In the present embodiment, the conductive layer 16 contains copper as a main component, and is formed by a plating method. In a process of forming the conductive layer 16, first, a resist is patterned on a conductive film to be the conductive layer 16 by photolithography. A portion of the conductive film to be the conductive layer 16 is removed by using the patterned resist to form the conductive layer 16. Then, the conductive layer 16 illustrated in FIG. 7C is formed by removing the resist.

Further, the side surface of the conductive layer 16 illustrated in FIG. 7C is roughly aligned with the side surface of the conductive layer 12, but the present disclosure may not be limited thereto. In a later process, since the side surface of the conductive layer 12 and the side surface of the conductive layer 16 are processed, the side surface of the conductive layer 16 and the side surface of the conductive layer 12 may not need to be aligned and, for example, may be configured so that the side surface of the conductive layer 16 does not overlap with the conductive layer 12 (the outer side surface 16b of the conductive layer 16 of the end portion side, where a portion of the conductive layer 16 to be described later protrudes, protrudes from the side surface 12a of the conductive layer 12).

When forming the conductive layer 16, fine irregularities may be formed on a top surface thereof. By such fine irregularities, the resin 20b to be formed in a subsequent process is entered and cured, thereby improving the adhesiveness.

By forming the conductive layer 12 and the conductive layer 16 separately, a conductive layer having a thickness of 100 μm or more can be formed, and the support base material 10 can be prevented from being warped when forming the conductive layer. Thus, it is possible to suppress adhesion failure between the terminal and the resin according to the present embodiment.

Figure 8A:
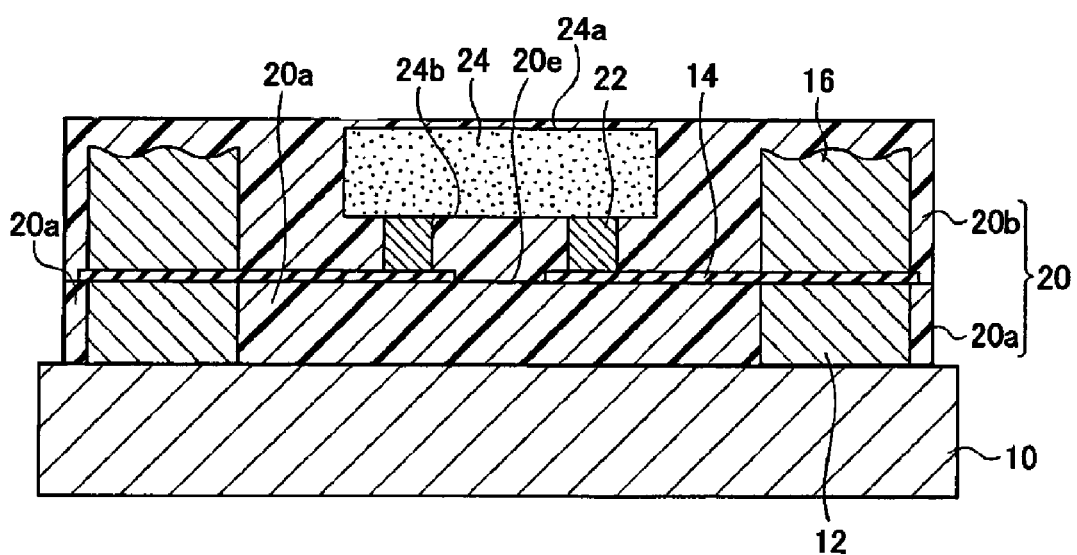

Next, as illustrated in FIG. 8A, the resin 20b, which covers the resin 20a, the wiring layer 14, the conductive layer 16, the conductive bonding layer 22, and the semiconductor element 24, is formed. The resin 20b corresponds to a portion of the resin 20 described above. That is, the combination of the resin 20a and the resin 20b described above corresponds to the resin 20. Furthermore, in this process, the resin interface 20e is formed. As the resin 20b in the present embodiment, a resin having electrical insulation, for example, a synthetic resin containing an epoxy resin as a main component, a polyimide resin, or the like, may be used.

Figure 8B:
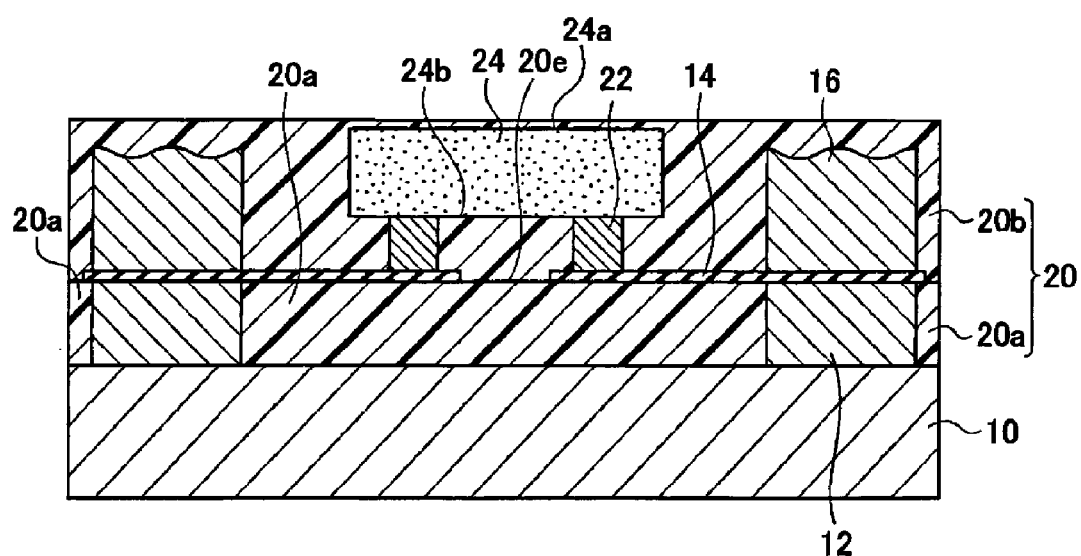

Next, as illustrated in FIG. 8B, the support base material 10 is cut by a circle cut using a cutting blade or the like.

Figure 9A:
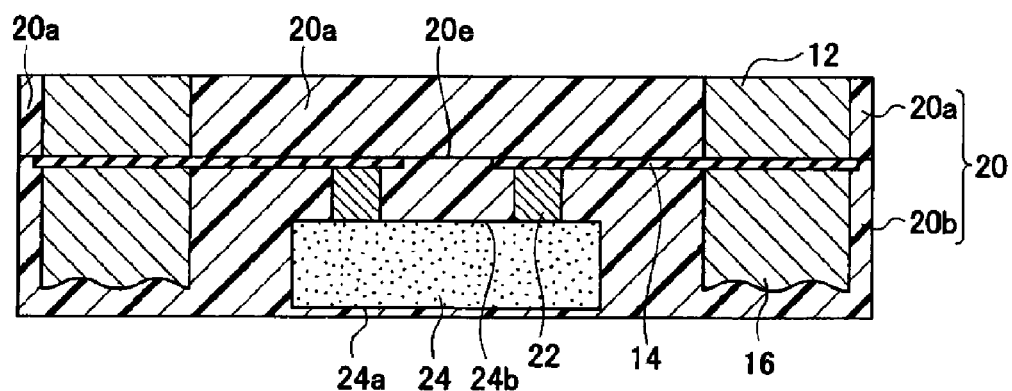

Next, as illustrated in FIG. 9A, the support base material 10 is removed. The support base material 10 may be removed by, for example, grinding by a grindstone or the like. Further, after the removal, a dicing tape (not shown) is attached to the resin 20 before the removal.

Figure 9B:
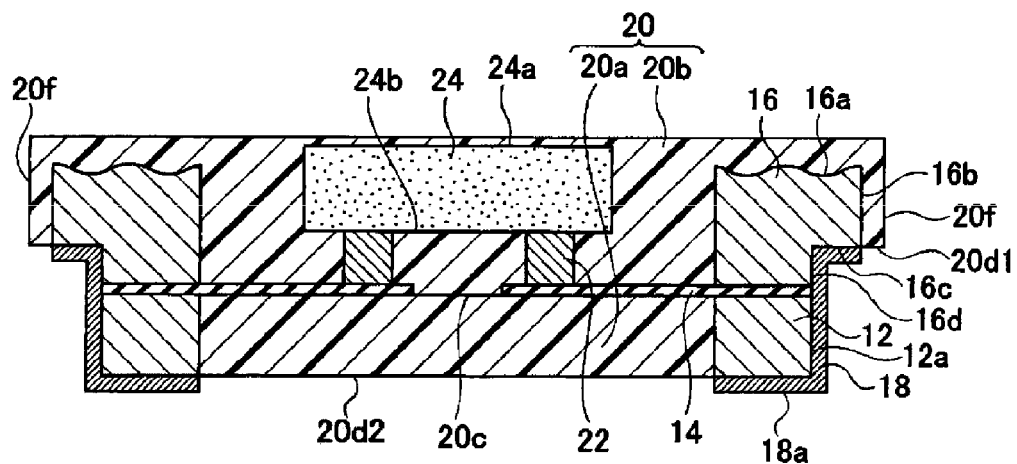

Next, as illustrated in FIG. 9B, a portion of the conductive layer 12, a portion of the wiring layer 14, a portion of the conductive layer 16, and a portion of the resin 20 are removed so that the end portion of the conductive layer 16 protrudes from the end portion of the conductive layer 12 and the end portion of the wiring layer 14. The removal may be performed by blade dicing or the like. Further, at this time, the dicing tape is not completely cut by blade dicing or the like. Therefore, although not shown, even when the resin is divided into individual pieces for each semiconductor element, they are not separated into pieces because they are connected by the dicing tape.

Figure 11:
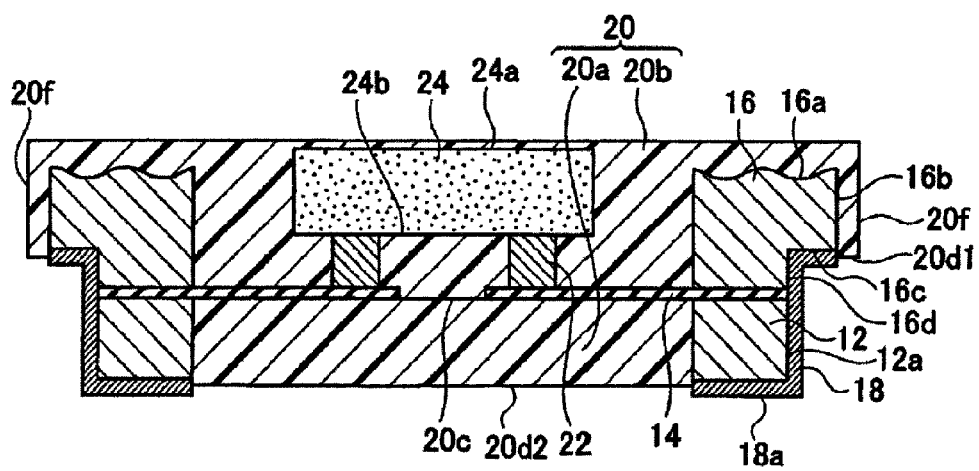
FIG. 11 is a view illustrating a positional relationship between a connection surface of an external electrode and a resin rear surface.

Next, end surfaces of the terminal (the side surface 12a of the conductive layer 12 at the end portion side where a portion of the conductive layer 16 protrudes, the side surface of the wiring layer 14, and the side surface 16d of the conductive layer 16 in a region that does not protrude), and the external electrode 18, which is in contact with the bottom surface 16c of the end portion of the conductive layer 16, are formed. Further, in order to etch the conductive layer 12 and the conductive layer 16 by 0.5 to 3 μm before the external electrode 18 is formed, the connection surface 18a of the external electrode 18 is located below the resin rear surface 20d1 and the resin rear surface 20d2 of the resin 20 and is exposed to the outside, as illustrated in FIG. 11. In the present embodiment, the external electrode 18 is formed by a plating method. Specifically, the external electrode 18 sequentially precipitates the Ni layer, the Pd layer, and the Au layer.

The semiconductor device including the terminal according to the present embodiment can be manufactured according to the aforementioned processes.

Figure 10:
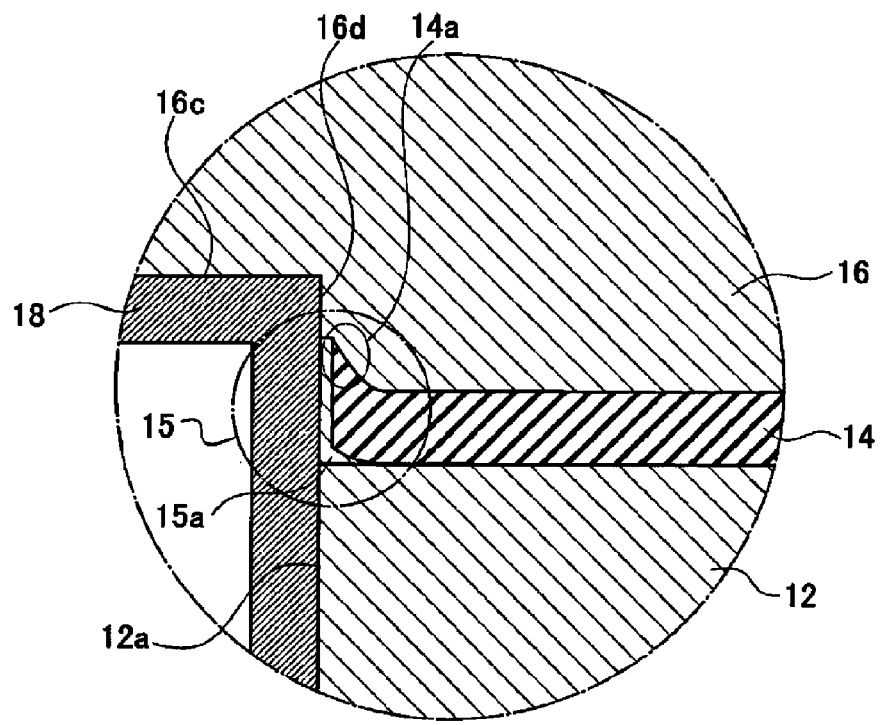
FIG. 10 is an enlarged schematic cross-sectional view of a portion of the schematic cross-sectional view illustrated in FIG. 4.

Further, when removing a portion of the conductive layer 12, the wiring layer 14, the conductive layer 16, and the resin 20 by blade dicing, in the region 30 illustrated in FIG. 4, there are cases where the metal having the material of the conductive layer 12 and the material of the conductive layer 16, which have a hardness smaller than that of the metal that is the material of the wiring layer 14, may extend to form a region 15 which covers the end portion 14a of the wiring layer 14 as illustrated in FIG. 10.

According to the present embodiment, the semiconductor device that suppresses adhesion failure and secures reliability can be provided. With the configuration of the present embodiment, it is possible to sufficiently secure the distance D of the contact portion between the external electrode 18 formed on the side surface of the semiconductor device and the end surface of the terminal. When mounting the semiconductor device on the circuit board or the like, solder is used, but if the distance D is not sufficiently secured, it is difficult to form solder fillet. In the semiconductor device according to the present embodiment, since the distance D can be sufficiently secured, the solder fillet can be easily formed when mounting the semiconductor device on the circuit board or the like. Thus, it is possible to increase the mounting strength of the semiconductor device on the circuit board. Furthermore, by performing a visual inspection on the connection state of the solder, a determination on whether the semiconductor device is a good product is facilitated. Thus, it is possible to improve the yield of the semiconductor device and to improve the reliability.

Second Embodiment

In this embodiment, a method of manufacturing a semiconductor device including a terminal, which is different from the first embodiment, will be described with reference to the drawings.

In this embodiment, different parts from the first embodiment will be described. That is, the description of the first embodiment can be applied to the parts which are not specifically described in the present embodiment.

Figure 12:
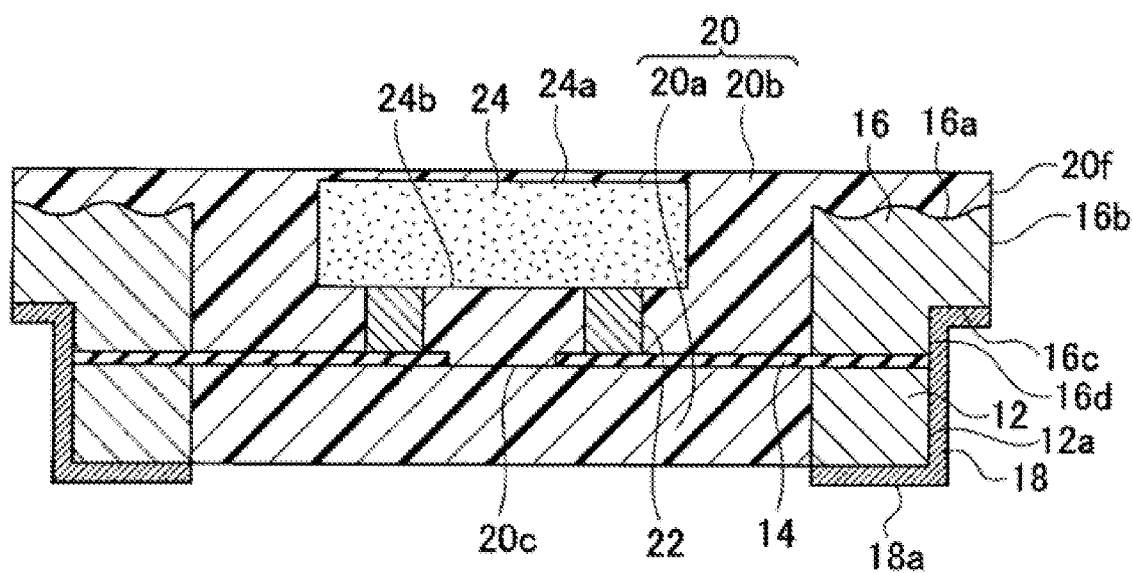
FIG. 12 is a schematic cross-sectional view of a semiconductor device including a terminal according to another embodiment of the present disclosure.

As illustrated in FIG. 12, the semiconductor device including a terminal according to the present embodiment includes a terminal, a semiconductor element 24 electrically connected to the terminal via a conductive bonding layer 22, and a resin 20 covering the semiconductor element 24. The terminal includes a conductive layer 12, a wiring layer 14 on the conductive layer 12, and an external electrode which is in contact with a bottom surface and a side surface of the conductive layer 12, a side surface of the wiring layer 14, a portion (side surface 16d) of the side surface of the conductive layer 16, and a portion (bottom surface 16c) of the bottom surface of the conductive layer 16, on the wiring layer 14. Further, a conductive bonding layer 22 is installed on the wiring layer 14 to be in contact therewith. In addition, the outer side surface 16b of the conductive layer 16 is exposed, and a resin side surface 20f and the outer side surface 16b are substantially aligned.

Since the outer side surface 16b of the conductive layer 16 is exposed and the resin side surface 20f and the outer side surface 16b are substantially aligned, when performing a visual inspection, the resin 20b does not interfere with the inspection. Thus, the determination on whether the semiconductor device is a good product is facilitated. Therefore, it is possible to improve the yield of the semiconductor device and to improve the reliability.

Here, a method of manufacturing the semiconductor device including the terminal according to the present embodiment will be described with reference to FIGS. 13 and 14B.

Figure 13:
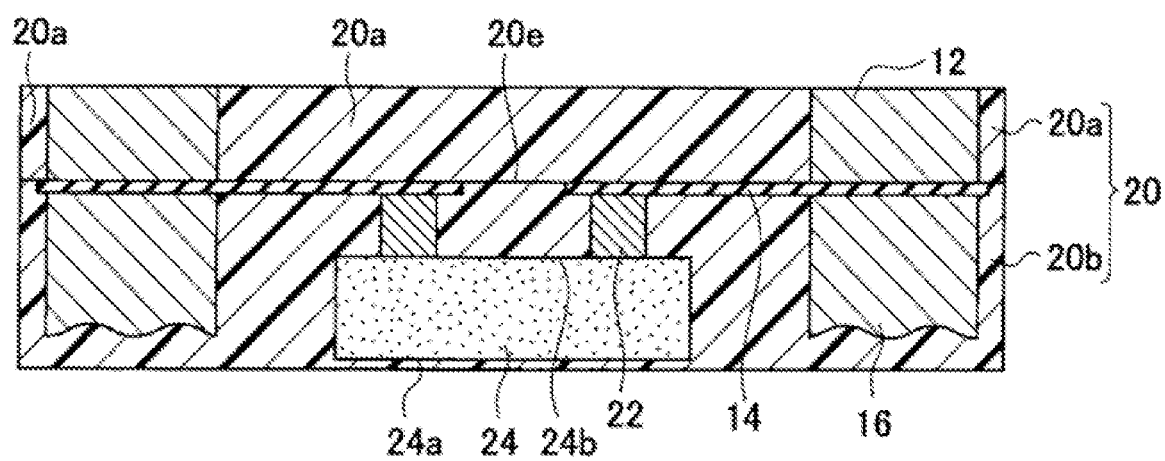
FIG. 13 is a schematic cross-sectional view illustrating a method of manufacturing a semiconductor device including a terminal according to another embodiment of the present disclosure, which is a process of grinding a support base material.

After following the process illustrated in FIG. 6A to FIG. 8A according to the first embodiment described above, the support base material 10 is removed as shown in FIG. 13. The support base material 10 may be removed by, for example, grinding by a grindstone or the like. Further, after the removal, a dicing tape (not shown) is attached to the resin 20 before the removal.

Figure 14A:
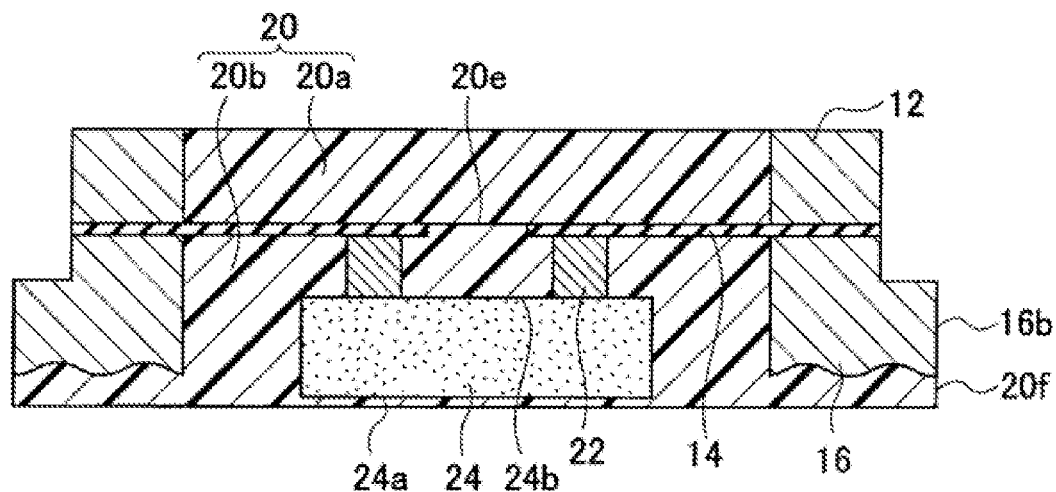

Next, as illustrated in FIG. 14A, a portion of the conductive layer 12, a portion of the wiring layer 14, a portion of the conductive layer 16, and a portion of the resin 20 are removed so that the end portion of the conductive layer 16 protrudes from the end portion of the conductive layer 12 and the end portion of the wiring layer 14. The removal may be performed by blade dicing or the like. Furthermore, at this time, a portion of the resin 20 is removed to expose the outer side surface 16b of the conductive layer 16. As a result, the resin is separated into individual semiconductor elements, although not shown in the figure.

Figure 14B:
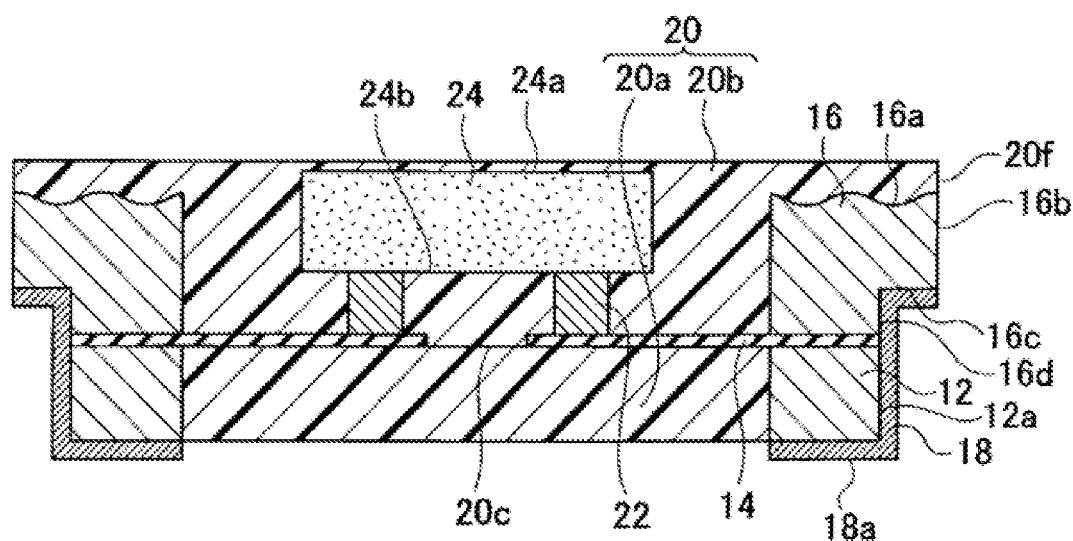

Next, as illustrated in FIG. 14B, end surfaces of the terminal (the side surface 12a of the conductive layer 12 at the end portion side where a portion of the conductive layer 16 protrudes, the side surface of the wiring layer 14, and the side surface 16d of the conductive layer 16 in a region that does not protrude), and the external electrode 18, which is in contact with the bottom surface 16c at the end portion of the conductive layer 16, are formed.

By the above process, the semiconductor device including the terminal according to the present embodiment can be manufactured.

Furthermore, similar to the first embodiment, a region 15, which covers the end portion 14a of the wiring layer 14 as illustrated in FIG. 10, is formed by blade dicing.

According to the present embodiment, the semiconductor device that suppresses the adhesion failure and secures the reliability can be provided. With the configuration of the present embodiment, it is possible to sufficiently secure the distance D of the contact portion between the external electrode 18 formed on the side surface of the semiconductor device and the end surface of the terminal. When mounting the semiconductor device on the circuit board or the like, solder is used, but if the distance D is not sufficiently secured, it is difficult to form solder fillet. In the semiconductor device according to the present embodiment, since the distance D can be sufficiently secured, the solder fillet can be easily formed when mounting the semiconductor device on the circuit board or the like. Thus, it is possible to increase the mounting strength of the semiconductor device on the circuit board. Since the outer side surface 16b of the conductive layer 16 is exposed and the resin side surface 20f and the outer side surface 16b are substantially aligned, when performing a visual inspection, the resin 20b does not interfere with the inspection. Thus, the determination on whether the semiconductor device is a good product is facilitated. Therefore, it is possible to improve the yield of the semiconductor device and to improve the reliability.

Other Embodiments

Although some embodiments have been described as discussed above, it should be understood that the description and drawings constituting a part of the present disclosure are merely illustrative and not limited. From this disclosure, various alternative embodiments, examples, and operation techniques will be apparent to those of ordinary skill in the art. As described above, the present embodiment includes various embodiments not described herein, such as a configuration in which the respective embodiments are combined.

The terminal and the semiconductor device according to the present embodiments can be used in various fields such as in-vehicle equipment, household appliances, medical equipment and the like. In particular, the terminal and the semiconductor device according to the present embodiments can be used in an in-vehicle wettable flank package to improve the functions, performance, quality, reliability, and convenience.

Aspects of Present Disclosure

Hereinafter, some aspects of the present disclosure will be additionally described as supplementary notes.
(Supplementary Note 1)

According to one aspect of the present disclosure, a method of manufacturing a terminal includes: forming a first conductive layer; forming a first resin covering the first conductive layer; grinding the first resin to expose a top surface of the first conductive layer; forming a wiring layer which is in contact with the first conductive layer; forming a second conductive layer on the wiring layer; forming a second resin which covers the first resin, the wiring layer, and the second conductive layer; removing a portion of the first conductive layer, a portion of the wiring layer, a portion of the second conductive layer, and a portion of the second resin so that an end portion of the second conductive layer protrudes from an end portion of the first conductive layer and an end portion of the wiring layer; and forming a conductive bonding layer which is in contact with the first conductive layer, the wiring layer, and the second conductive layer.
(Supplementary Note 2)

In the method of manufacturing a terminal of Supplementary Note 1, the second conductive layer is thicker than the first conductive layer, and the wiring layer is thinner than the first conductive layer.
(Supplementary Note 3)

In the method of manufacturing a terminal of Supplementary Note 1, a distance between a bottom surface of the first conductive layer and a bottom surface of the end portion of the second conductive layer is 100 μm or more.
(Supplementary Note 4)

In the method of manufacturing a terminal of Supplementary Note 1, an outer side surface of the second conductive layer is exposed.
(Supplementary Note 5)

According to another aspect of the present disclosure, a method of manufacturing a semiconductor device includes: the method of manufacturing the terminal of Supplementary Note 1; and forming a semiconductor element electrically connected to the wiring layer after forming the wiring layer and before forming the second conductive layer.

According to the present disclosure in some embodiments, it is possible to provide a terminal for external connection which suppresses adhesion failure and secures reliability, a semiconductor device including the terminal, and a method of manufacturing the terminal.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
an internal electrode;
a semiconductor element electrically connected to the internal electrode; and
a resin covering the internal electrode and the semiconductor element,
wherein the semiconductor element includes:
  a first electrode; and
  a conductive bonding layer on the internal electrode,
wherein the internal electrode includes:
  a wiring layer portion to which the semiconductor element is mounted by flip chip bonding with the conductive bonding layer of the semiconductor element;
  a first conductive portion which is located below the wiring layer portion and is located on an opposite side of the semiconductor element with respect to the wiring layer portion; and
  a second conductive portion which is located over the first conductive portion and is electrically connected to both of the first conductive portion and the wiring layer portion, and
wherein an end portion of the second conductive portion protrudes from an end portion of the first conductive portion by 10 µm or more in a lateral direction.

2. The semiconductor device of claim 1, wherein the second conductive portion includes a convexly protruding portion.

3. The semiconductor device of claim 1, wherein the end portion of the second conductive portion protrudes 10 to 20 µm.

4. The semiconductor device of claim 1, wherein a distance between a bottom surface of the first conductive portion and a bottom surface of the end portion of the second conductive portion is 100 µm or more.

5. The semiconductor device of claim 1, wherein the second conductive portion is thicker than the first conductive portion.

6. The semiconductor device of claim 1, wherein the wiring layer portion is thinner than the first conductive portion.

7. The semiconductor device of claim 1, wherein an end portion of the wiring layer portion is covered with a material of the first conductive portion and a material of the second conductive portion.

8. The semiconductor device of claim 1, further comprising:
an external electrode that is in physical contact with the end portion of the first conductive portion.

9. The semiconductor device of claim 8, wherein the external electrode includes a Ni layer, which is in contact with the first conductive portion, and includes an Au layer over the Ni layer.

10. The semiconductor device of claim 1, wherein an outer side surface of the second conductive portion is exposed.

11. The semiconductor device of claim 10, wherein a side surface of the resin and the outer side surface of the second conductive portion are substantially aligned.

12. The semiconductor device of claim 1, wherein the conductive bonding layer includes a solder layer.

13. The semiconductor device of claim 12, wherein the conductive bonding layer further includes a Cu layer.

14. The semiconductor device of claim 1, wherein the first conductive portion contains copper, and the second conductive portion contains copper.

15. The semiconductor device of claim 14, wherein the wiring layer portion contains titanium or tantalum nitride.

16. The semiconductor device of claim 1, wherein an opposite part of the wiring layer portion to which the semiconductor element is mounted is covered by the resin and is not exposed.

17. The semiconductor device of claim 1, wherein the semiconductor device is used as an in-vehicle wettable flank package semiconductor device.

18. The semiconductor device of claim 1, wherein a solder fillet is formed on a circuit board on which the semiconductor device is mounted.

* * * * *